(12) United States Patent
Wang et al.

(10) Patent No.: US 12,324,119 B2
(45) Date of Patent: Jun. 3, 2025

(54) SLIDING LATCH FOR RETENTION OF PERIPHERAL DEVICE

(71) Applicant: Dell Products L.P., Round Rock, TX (US)

(72) Inventors: Rong Yu Wang, New Taipei (TW); Hsu Min Jen, New Taipei (TW); Chun Hsiung Wang, Taoyuan (TW); Shu Hao Lu, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 331 days.

(21) Appl. No.: 18/165,386

(22) Filed: Feb. 7, 2023

(65) Prior Publication Data

US 2024/0268052 A1 Aug. 8, 2024

(51) Int. Cl.
*H05K 7/14* (2006.01)
*H01R 12/70* (2011.01)

(52) U.S. Cl.
CPC ....... *H05K 7/1417* (2013.01); *H01R 12/7005* (2013.01); *H05K 7/1407* (2013.01)

(58) Field of Classification Search
CPC ............... H05K 7/1417; H05K 7/1407; H01R 12/7005; G06F 1/185
See application file for complete search history.

(56) References Cited

U.S. PATENT DOCUMENTS

| | | | | |
|---|---|---|---|---|
| 5,222,897 A * | 6/1993 | Collins | ................ | H05K 7/1409 361/801 |
| 5,721,669 A * | 2/1998 | Becker | ................. | G11B 33/124 |
| 6,411,517 B1 * | 6/2002 | Babin | .................. | H05K 7/1461 361/759 |
| 6,685,489 B1 * | 2/2004 | Rubenstein | ........ | H01R 12/7005 439/157 |
| 6,752,276 B2 * | 6/2004 | Rumney | ................ | H05K 7/142 361/801 |
| 7,283,371 B1 * | 10/2007 | Grouell | .................... | G06F 1/185 361/801 |
| 7,297,015 B1 * | 11/2007 | Desrosiers | ........... | H05K 7/1402 361/755 |
| 7,300,299 B2 * | 11/2007 | Wang | ..................... | H05K 7/142 439/326 |
| 7,364,447 B1 * | 4/2008 | Desrosiers | ............. | G06F 1/186 439/372 |

(Continued)

*Primary Examiner* — Anthony M Haughton
*Assistant Examiner* — Theron S Milliser
(74) *Attorney, Agent, or Firm* — Jackson Walker L.L.P.

(57) ABSTRACT

A latch assembly may include a guide base configured to fixedly couple to a circuit board and having a guiding feature, an axis configured to rotatably couple to the circuit board and having a driving feature, and a sliding latch including a guide feature configured to mechanically engage with the guiding feature to constrain movement of the sliding latch in a linear direction relative to the circuit board and a drive feature configured to mechanically engage with the driving feature such that in a first rotational position of the axis relative to the circuit board, the driving feature mechanically drives the sliding latch to a first position relative to a connector of the circuit board and in a second rotational position of the axis relative to the circuit board, the driving feature mechanically drives the sliding latch to a second position relative to the connector.

21 Claims, 4 Drawing Sheets

(56) References Cited

U.S. PATENT DOCUMENTS

| | | | | |
|---|---|---|---|---|
| 7,394,666 B2* | 7/2008 | Edwards | H05K 7/142 | 361/803 |
| 7,420,820 B1* | 9/2008 | Lima | H05K 7/1407 | 361/747 |
| 7,435,114 B2* | 10/2008 | Desrosiers | G06F 1/186 | 439/372 |
| 7,679,933 B2* | 3/2010 | Makabe | G06F 1/185 | 361/740 |
| 7,920,388 B2* | 4/2011 | Huang | G06F 1/185 | 361/801 |
| 8,248,817 B2* | 8/2012 | Yeh | H05K 7/142 | 361/752 |
| 8,517,744 B2* | 8/2013 | Lin | H01R 12/73 | 439/62 |
| 9,214,749 B2* | 12/2015 | Li | H01R 13/62944 | |
| 9,524,001 B2* | 12/2016 | Liu | H05K 7/1487 | |
| 9,703,331 B1* | 7/2017 | Chien | G06F 1/185 | |
| 9,740,249 B2* | 8/2017 | Top | H01R 13/62922 | |
| 9,917,384 B2* | 3/2018 | Liu | H05K 7/1487 | |
| 10,033,123 B2* | 7/2018 | Liu | H01R 12/7058 | |
| 10,609,835 B1* | 3/2020 | Liu | H05K 7/1487 | |
| 10,707,636 B2* | 7/2020 | Yamamoto | H05K 3/366 | |
| 11,388,829 B2* | 7/2022 | Shih | H05K 7/1488 | |
| 11,778,768 B2* | 10/2023 | Baldwin, Jr. | H05K 7/1405 | 361/796 |
| 2006/0090927 A1* | 5/2006 | Edwards | H05K 7/142 | 174/138 G |
| 2007/0105425 A1* | 5/2007 | Wang | H05K 7/142 | 439/326 |
| 2008/0153331 A1* | 6/2008 | Desrosiers | H05K 7/1415 | 439/157 |
| 2008/0232057 A1* | 9/2008 | Desrosiers | H05K 7/1402 | 29/757 |
| 2008/0232072 A1* | 9/2008 | Edwards | H05K 7/142 | 439/573 |
| 2010/0091453 A1* | 4/2010 | Huang | G06F 1/185 | 361/679.58 |
| 2010/0296241 A1* | 11/2010 | Yeh | G06F 1/184 | 361/679.58 |
| 2012/0240704 A1* | 9/2012 | Li | H05K 7/1409 | 74/412 R |
| 2014/0254086 A1* | 9/2014 | Li | H05K 7/1489 | 439/64 |
| 2016/0064040 A1* | 3/2016 | Hartman | H05K 7/1402 | 360/97.12 |
| 2016/0190715 A1* | 6/2016 | Liu | H01R 12/7058 | 439/325 |
| 2016/0380369 A1* | 12/2016 | Liu | H01R 12/7058 | 439/325 |
| 2018/0123269 A1* | 5/2018 | Liu | H01R 12/7058 | |
| 2022/0312605 A1* | 9/2022 | Wang | H05K 7/142 | |
| 2024/0268052 A1* | 8/2024 | Wang | G06F 1/185 | |
| 2024/0297459 A1* | 9/2024 | Li | H05K 1/18 | |

* cited by examiner

SLIDING LATCH FOR RETENTION OF PERIPHERAL DEVICE

TECHNICAL FIELD

The present disclosure relates in general to information handling systems, and more particularly to a sliding latch that may be used for retention of a peripheral device in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often include receptacle connectors mounted on a motherboard or other circuit board, wherein each receptacle connector is configured to receive an edge connector of a peripheral card (e.g., another circuit board) in order to mechanically and electrically couple the peripheral card to the motherboard. Examples of such peripheral devices include a hook or similar retention feature configured to engage with a latch of the receptacle connector in order to maintain electrical and mechanical coupling of the peripheral device, and to prevent the peripheral device from becoming unseated from the receptacle connector.

However, due to densities of components present on modern motherboards, it may be difficult for a user or technician of the information handling system to be able to physically engage (e.g., with a finger) to lock and/or unlock these latches.

SUMMARY

In accordance with the teachings of the present disclosure, the disadvantages and problems associated with existing approaches to maintaining a peripheral device seated in a connector may be reduced or eliminated.

In accordance with embodiments of the present disclosure, an information handling system may include a circuit board, a connector mechanically mounted upon the circuit board, and a latch assembly mechanically coupled to the circuit board. The latch assembly may include a guide base fixedly coupled to the circuit board and having a guiding feature, an axis rotatably coupled to the circuit board and having a driving feature and a sliding latch. The sliding latch may include a guide feature configured to mechanically engage with the guiding feature to constrain movement of the sliding latch in a linear direction relative to the circuit board and a drive feature configured to mechanically engage with the driving feature such that in a first rotational position of the axis relative to the circuit board, the driving feature mechanically drives the sliding latch to a first position relative to the connector and in a second rotational position of the axis relative to the circuit board, the driving feature mechanically drives the sliding latch to a second position relative to the connector which is closer to the connector than the first position.

In accordance with these and other embodiments of the present disclosure, a latch assembly configured to mechanically couple to a circuit board having a connector mechanically mounted upon the circuit board may include a guide base configured to fixedly couple to the circuit board and having a guiding feature, an axis configured to rotatably couple to the circuit board and having a driving feature, and a sliding latch. The sliding latch may include a guide feature configured to mechanically engage with the guiding feature to constrain movement of the sliding latch in a linear direction relative to the circuit board and a drive feature configured to mechanically engage with the driving feature such that in a first rotational position of the axis relative to the circuit board, the driving feature mechanically drives the sliding latch to a first position relative to the connector and in a second rotational position of the axis relative to the circuit board, the driving feature mechanically drives the sliding latch to a second position relative to the connector which is closer to the connector than the first position.

In accordance with these and other embodiments of the present disclosure, a method may include fixedly coupling a guide base to a circuit board having a connector mechanically mounted upon the circuit board, the guide base having a guiding feature, rotatably coupling an axis to the circuit board, the axis having a driving feature, and mechanically coupling a sliding latch to the guide base, the sliding latch comprising a guide feature configured to mechanically engage with the guiding feature to constrain movement of the sliding latch in a linear direction relative to the circuit board and a drive feature configured to mechanically engage with the driving feature such that in a first rotational position of the axis relative to the circuit board, the driving feature mechanically drives the sliding latch to a first position relative to the connector and in a second rotational position of the axis relative to the circuit board, the driving feature mechanically drives the sliding latch to a second position relative to the connector which is closer to the connector than the first position.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1A through 2B, wherein like numbers are used to indicate like and corresponding parts.

For the purposes of this disclosure, an information handling system may include any instrumentality or aggregate of instrumentalities operable to compute, classify, process, transmit, receive, originate, retrieve, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, a circuit board may broadly refer to a printed circuit board (PCB), printed wiring board (PWB), printed wiring assembly (PWA) etched wiring board, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

Figure 1A:
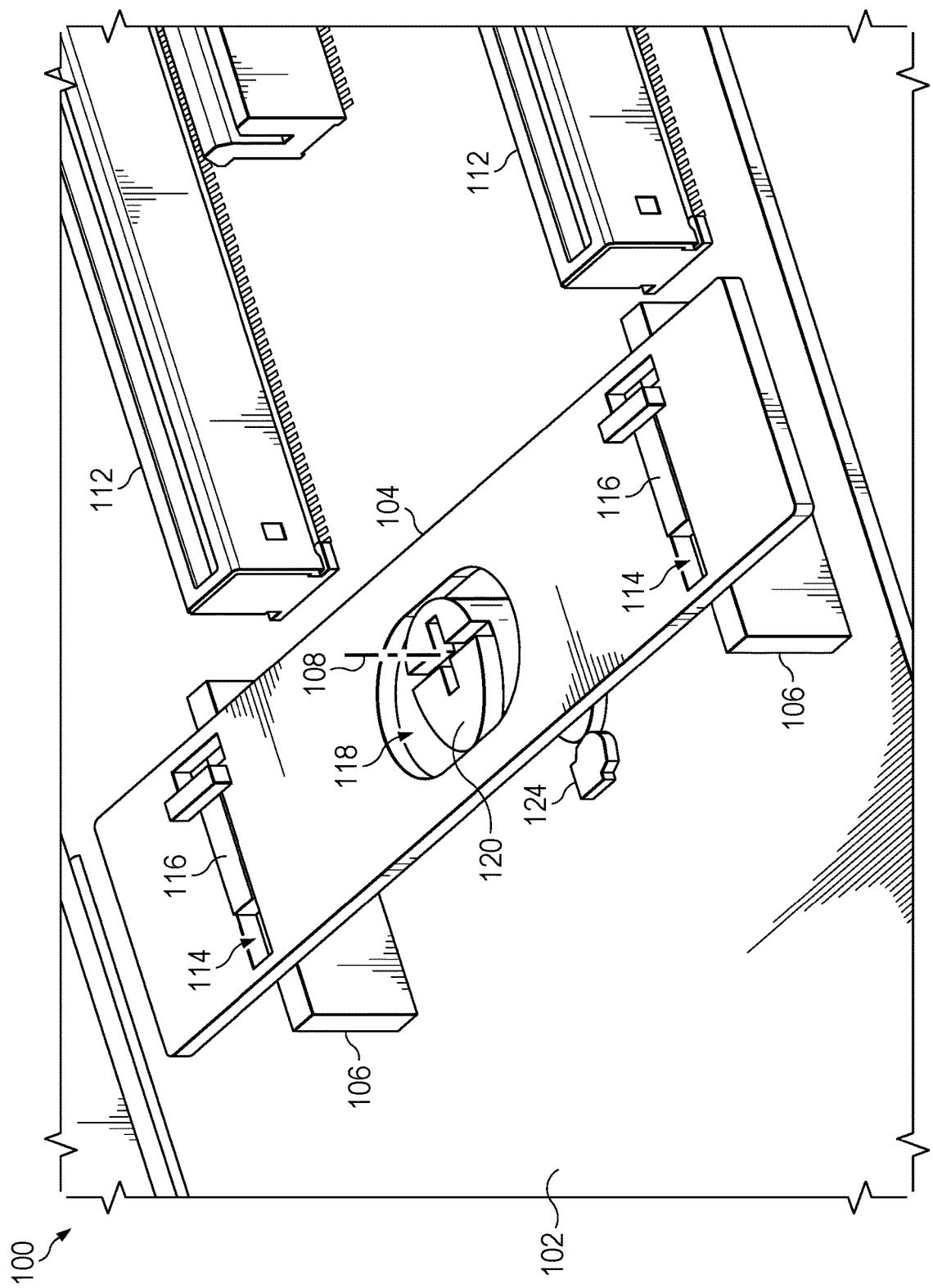
FIGS. 1A and 1B each illustrate a perspective view of selected components of an information handling system, including a sliding latch mechanically coupled to a motherboard, in accordance with embodiments of the present disclosure.
Figure 1B:
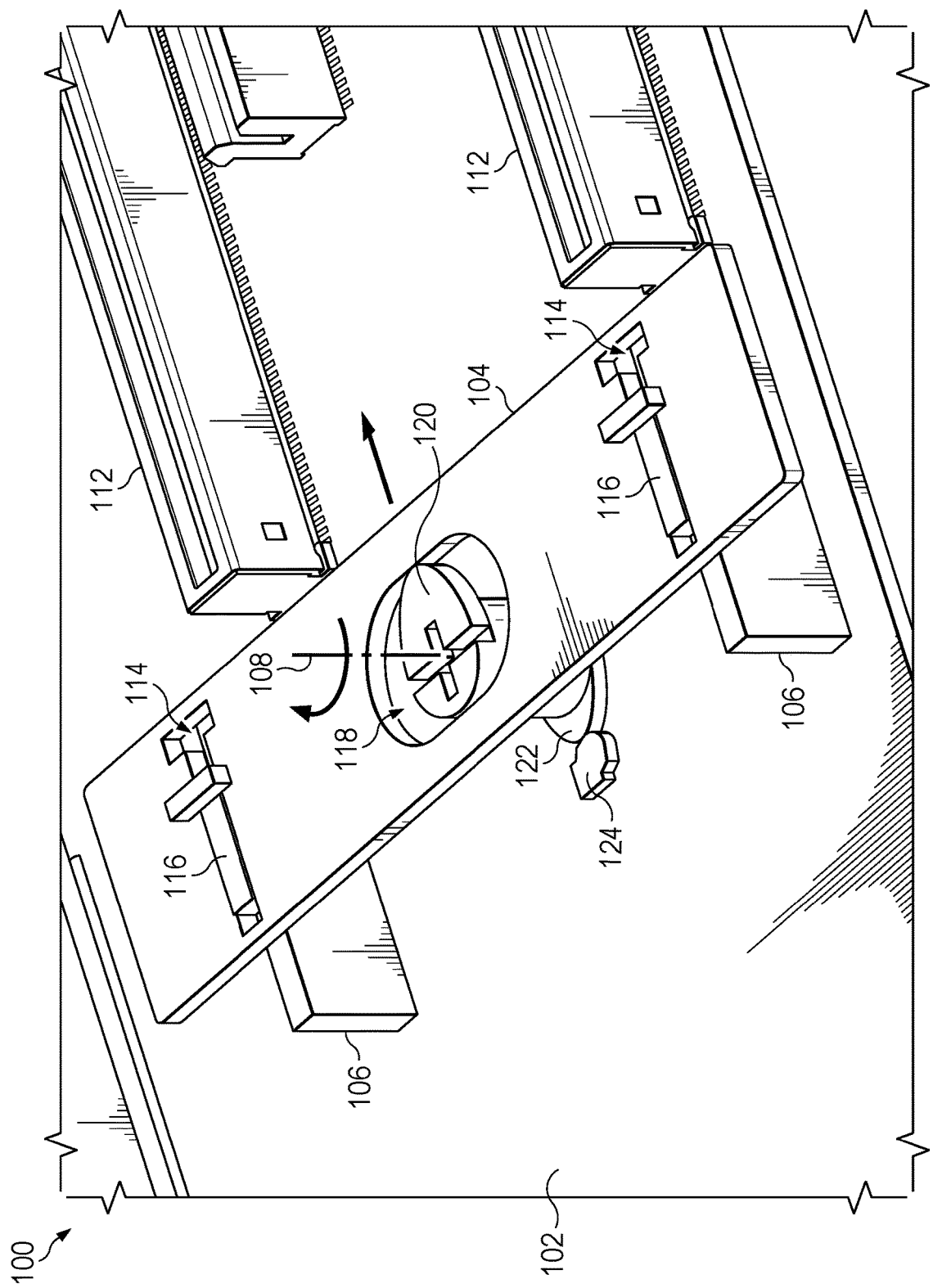

FIGS. 1A and 1B each illustrate a perspective view of selected components of an information handling system 100, including a sliding latch 104 mechanically coupled to a circuit board 102, in accordance with embodiments of the present disclosure. As shown in FIGS. 1A and 1B, sliding latch 104 may be part of a latch assembly comprising sliding latch 104, guide bases 106 fixedly mounted on circuit board 102, and an axis 108 rotatably coupled to circuit board 102. As shown in FIGS. 1A and 1B, such latch assembly may be located proximate to one or more connectors 112 (e.g., receptacle connectors) mounted on circuit board 102.

Circuit board 102 may comprise any circuit board configured to provide structural support for one or more information handling resources of information handling system 100 and/or electrically couple one or more of such information handling resources to each other and/or to other electric or electronic components external to information handling system 100. For example, in some embodiments, circuit board 102 may include a motherboard which may include or have mounted thereon one or more processors and/or one or more memories in addition to the latch assembly and connectors 112.

As shown in FIGS. 1A and 1B, sliding latch 104 may generally comprise a plate formed of metal, plastic, or other suitable material that is generally planar in shape, having a width substantially larger (e.g., at least five times greater) then its thickness and having a length substantially larger (e.g., at least two times greater) than its width. As also shown in FIGS. 1A and 1B, sliding latch 104 may have one or more guide slots 114 formed through the thickness of sliding latch 104 and configured (e.g., sized and/or shaped) to engage with guide features 116 of guide bases 106, in order to constrain mechanical translation of sliding latch 104 relative to circuit board 102 in a direction parallel to the width of sliding latch 104.

Guide bases 106 may be fixedly mounted to circuit board 102, and may be configured (e.g., sized and/or shaped) such that when sliding latch 104 is coupled to guide bases 106 via guide slots 114 and guide features 116, sliding latch 104 may be at a height from circuit board 102 which may allow an edge of sliding latch 104 to engage with a corresponding retention feature of one or more information handling resources populated within connectors 112, in order to retain such information handling resources within connectors 112, as described in greater detail below.

As additionally shown in FIGS. 1A and 1B, sliding latch 104 may include a drive opening 118 formed through the thickness of sliding latch 104 and configured to mechanically engage with a head 120 of axis 108 in order to mechanically drive mechanical translation of sliding latch 104 relative to circuit board 102, as described in greater detail below. As shown in FIGS. 1A and 1B, drive opening 118 may be configured (e.g., sized and/or shaped) such that: (i) when axis 108 is in a first rotational position relative to circuit board 102 as shown in FIG. 1A, mechanical engagement of head 120 with an inner edge of drive opening 118 causes sliding latch 104 to be in a first position relative to connectors 112; and (ii) when axis 108 is in a second rotational position relative to circuit board 102 (e.g., 180 degrees from the first rotational position) as shown in FIG. 1B, mechanical engagement of head 120 with a different portion of the inner edge of drive opening 118 causes sliding latch 104 to be in a second position relative to connectors 112, wherein sliding latch 104 is closer to connectors 112 in the second position as compared to the first position.

As an example, in some embodiments, drive opening 118 may be generally oval in shape, but not necessarily elliptical in shape. In other words, as shown in FIGS. 1A and 1B, a shape of drive opening 118 as seen through the thickness of sliding latch 104 may have two opposite curved sections separated by two opposite straight sections, such that mechanical engagement between head 120 and these straight sections may drive translation of sliding latch 104 between the first position and the second position and vice versa.

In some embodiments, head 120 may include a screw drive formed therein to allow a user and/or technician of information handling system 100 to use a screwdriver and/or other tool to provide a mechanical torque to head 120 and axis 108 to cause axis 108 to rotate relative to circuit board 102. For purposes of clarity and exposition, FIGS. 1A and 1B depict head 120 having a combination slotted/Phillips screw drive such that a user or technician may use either a flat screwdriver or Phillips screwdriver to mechanically engage with head 120. However, any other suitable type of screw drive may be used.

As further shown in FIG. 1B, axis 108 may include extending from a shaft thereof a signaling feature 122 configured to, in the second rotational position of axis 108, mechanically and/or electrically engage with a corresponding switch 124 mounted to or formed on circuit board 102. For example, in some embodiments, switch 124 may comprise a pad or other conductive feature such that when signaling feature 122 is in physical contact with switch 124, a circuit is completed that communicates a signal indicating that axis 108 is in the second rotational position, which may indicate that any information handling resources disposed in connectors 112 are properly latched in place. In such embodiments, signaling feature 122 may be electrically coupled to a supply rail or ground rail in order to complete an electrical circuit when axis 108 is in the second rotational position. As another example, in other embodiments, switch 124 may comprise a mechanical button that generates a signal in response to signaling feature 122 mechanically engaging with switch 124.

Figure 2A:
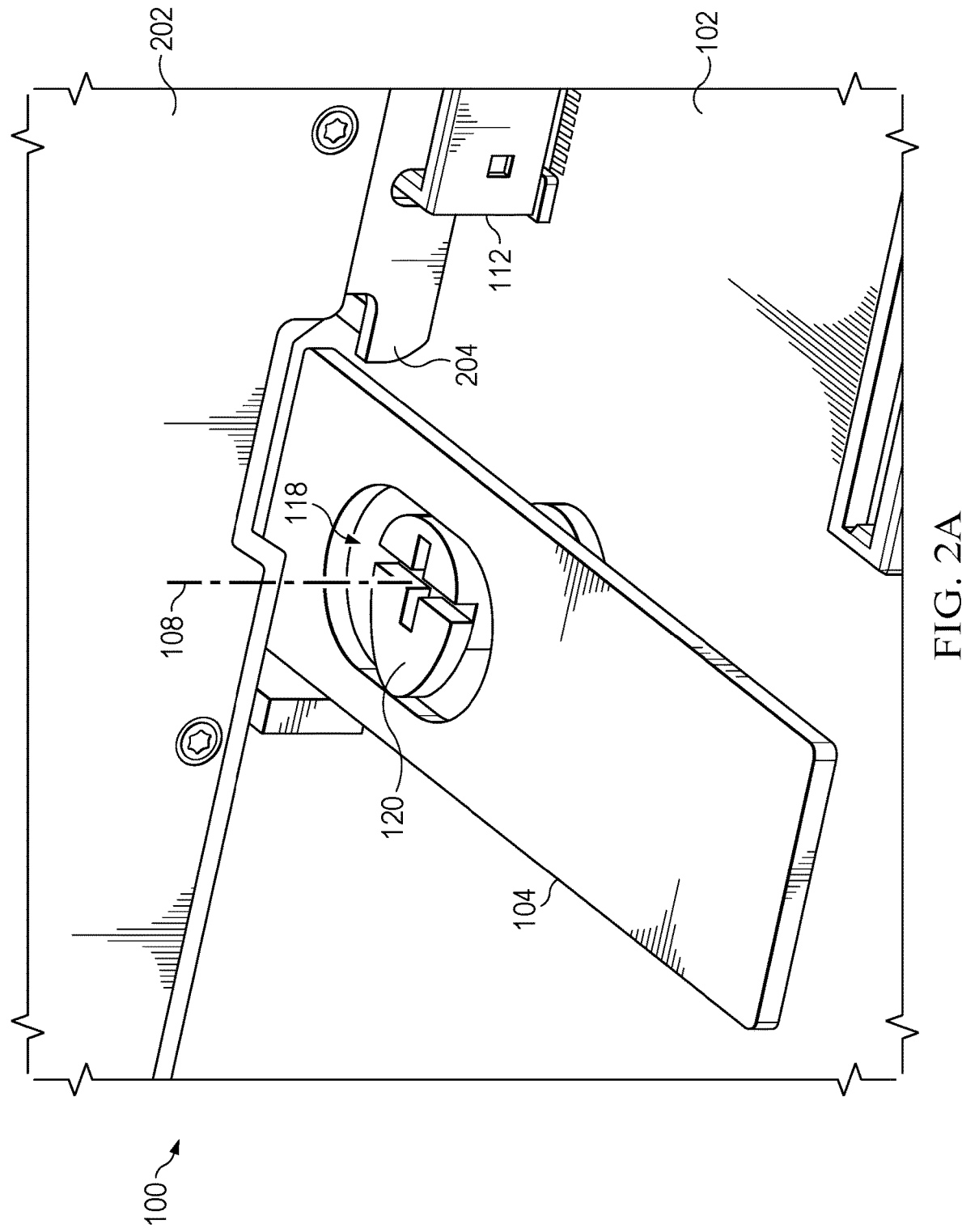
FIGS. 2A and 2B each illustrate another perspective view of selected components of the information handling system depicted in FIGS. 1A and 1B, including depiction of engagement with and disengagement of the sliding latch from a retention feature of a peripheral device, in accordance with embodiments of the present disclosure.
Figure 2B:
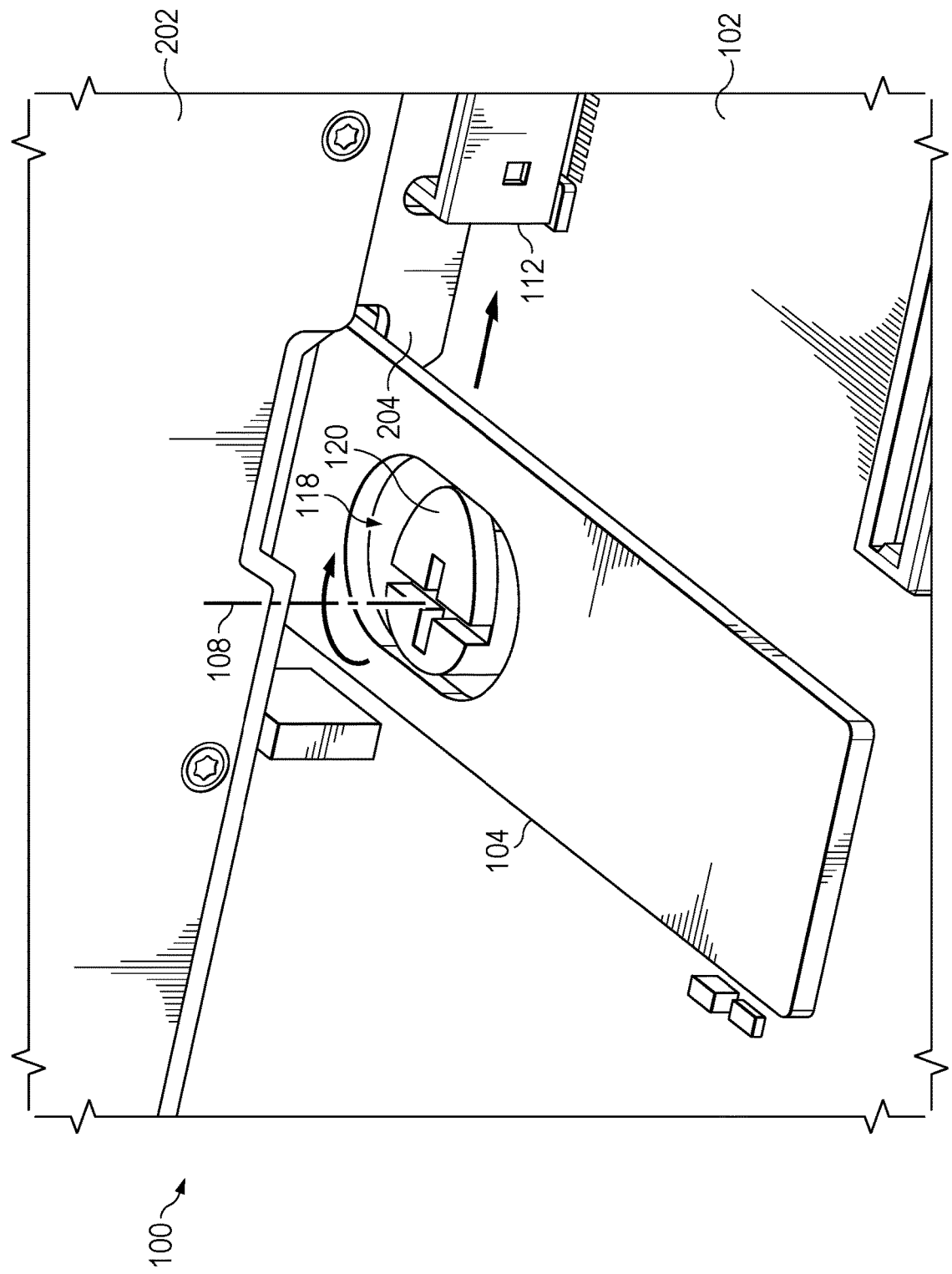

FIGS. 2A and 2B each illustrate another perspective view of selected components of information handling system 100, in accordance with embodiments of the present disclosure. FIG. 2A depicts axis 108 in its first rotational position and sliding latch 104 in its first position, such that latch 104 is mechanically disengaged from a retention feature 204 (e.g., a hook) of an information handling resource 202 seated within connector 112. On the other hand, FIG. 2B depicts axis 108 in its second rotational position and sliding latch 104 in its second position, such that latch 104 is mechanically engaged with retention feature 204 in order to mechanically retain information handling resource 202 seated within connector 112.

For purposes of clarity and exposition, FIGS. 2A and 2B have omitted certain features that may be present, including without limitation guide bases 106, guide slots 114, guide features 116, signaling feature 122, and switch 124.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112 (f) unless the words "means for" or "step for" are explicitly used in the particular claim.

What is claimed is:

1. An information handling system comprising:
   a circuit board;
   a connector mechanically mounted upon the circuit board; and
   a latch assembly mechanically coupled to the circuit board and comprising:
   a guide base fixedly coupled to the circuit board and having a guiding feature;
   an axis rotatably coupled to the circuit board and having a driving feature; and
   a sliding latch comprising:
   a guide feature configured to mechanically engage with the guiding feature to constrain movement of the sliding latch in a linear direction relative to the circuit board; and
   a drive feature configured to mechanically engage with the driving feature such that:

in a first rotational position of the axis relative to the circuit board, the driving feature mechanically drives the sliding latch to a first position relative to the connector; and in a second rotational position of the axis relative to the circuit board, the driving feature mechanically drives the sliding latch to a second position relative to the connector which is closer to the connector than the first position.

2. The information handling system of claim 1, wherein the sliding latch is configured to, when in its second position, mechanically engage to a retention feature of an information handling resource seated within the connector in order to mechanically maintain the information handling resource within the connector.

3. The information handling system of claim 1, wherein the connector is a receptacle connector.

4. The information handling system of claim 1, wherein the guide feature is a slot formed through a thickness of the sliding latch.

5. The information handling system of claim 1, wherein the drive feature is an opening formed through a thickness of the sliding latch.

6. The information handling system of claim 5, wherein the opening is oval-shaped.

7. The information handling system of claim 1, wherein the driving feature is a screw head of the axis.

8. The information handling system of claim 1, wherein the first rotational position and the second rotational feature differ by approximately 180 degrees.

9. The information handling system of claim 1, wherein the guide base has a height such that the sliding latch is offset from the circuit board by a distance allowing the sliding latch to mechanically engage to a retention feature of an information handling resource seated within the connector.

10. The information handling system of claim 1, further comprising a switch formed on the circuit board and the axis further comprising a signaling feature configured to engage with the switch such that the switch generates an electrical signal indicating when the axis is in its second rotational position.

11. A latch assembly configured to mechanically couple to a circuit board having a connector mechanically mounted upon the circuit board, the latch assembly comprising:

a guide base configured to fixedly couple to the circuit board and having a guiding feature;

an axis configured to rotatably couple to the circuit board and having a driving feature; and a sliding latch comprising:

a guide feature configured to mechanically engage with the guiding feature to constrain movement of the sliding latch in a linear direction relative to the circuit board; and a drive feature configured to mechanically engage with the driving feature such that:

in a first rotational position of the axis relative to the circuit board, the driving feature mechanically drives the sliding latch to a first position relative to the connector; and in a second rotational position of the axis relative to the circuit board, the driving feature mechanically drives the sliding latch to a second position relative to the connector which is closer to the connector than the first position.

12. The latch assembly of claim 11, wherein the sliding latch is configured to, when in its second position, mechanically engage to a retention feature of an information handling resource seated within the connector in order to mechanically maintain the information handling resource within the connector.

13. The latch assembly of claim 11, wherein the connector is a receptacle connector.

14. The latch assembly of claim 11, wherein the guide feature is a slot formed through a thickness of the sliding latch.

15. The latch assembly of claim 11, wherein the drive feature is an opening formed through a thickness of the sliding latch.

16. The latch assembly of claim 15, wherein the opening is oval-shaped.

17. The latch assembly of claim 11, wherein the driving feature is a screw head of the axis.

18. The latch assembly of claim 11, wherein the first rotational position and the second rotational feature differ by approximately 180 degrees.

19. The latch assembly of claim 11, wherein the guide base has a height such that the sliding latch is offset from the circuit board by a distance allowing the sliding latch to mechanically engage to a retention feature of an information handling resource seated within the connector.

20. The latch assembly of claim 11, the axis further comprising a signaling feature configured to engage with a switch formed on the circuit board such that the switch generates an electrical signal indicating when the axis is in its second rotational position.

21. A method comprising:

fixedly coupling a guide base to a circuit board having a connector mechanically mounted upon the circuit board, the guide base having a guiding feature;

rotatably coupling an axis to the circuit board, the axis having a driving feature; and mechanically coupling a sliding latch to the guide base, the sliding latch comprising:

a guide feature configured to mechanically engage with the guiding feature to constrain movement of the sliding latch in a linear direction relative to the circuit board; and a drive feature configured to mechanically engage with the driving feature such that:

in a first rotational position of the axis relative to the circuit board, the driving feature mechanically drives the sliding latch to a first position relative to the connector; and in a second rotational position of the axis relative to the circuit board, the driving feature mechanically drives the sliding latch to a second position relative to the connector which is closer to the connector than the first position.

* * * * *